US008871560B2

(12) United States Patent  
Ahmed et al.

(10) Patent No.: US 8,871,560 B2  
(45) Date of Patent: Oct. 28, 2014

(54) PLASMA ANNEALING OF THIN FILM SOLAR CELLS

(75) Inventors: Shafaat Ahmed, Yorktown Heights, NY (US); Sukjay Chey, New York, NY (US); Hariklia Deligianni, Tenafly, NJ (US); Lubomyr T. Romankiw, Briancliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/571,048

(22) Filed: Aug. 9, 2012

(65) Prior Publication Data

US 2014/0045295 A1 Feb. 13, 2014

(51) Int. Cl.
*H01L 31/032* (2006.01)
*H01L 31/0749* (2012.01)

(52) U.S. Cl.
USPC .......... 438/95; 438/584; 438/73; 257/E21.54; 257/E31.008

(58) Field of Classification Search
CPC ............ H01L 31/0324; H01L 31/2412; H01L 21/02417; H01L 31/0322; H01L 21/0237; H01L 21/02568; H01L 31/0749; H01L 31/18; H01L 31/0326; H01L 31/1864; C23C 14/0623; C23C 14/3464
USPC ......... 438/95, 584, 73; 257/E21.54, E31.008; 420/587; 136/256, 262; 977/773
See application file for complete search history.

(56) References Cited

U.S. PATENT DOCUMENTS

| | | | |
|---|---|---|---|
| 2005/0028861 A1* | 2/2005 | Aoki et al. ................... | 136/256 |
| 2005/0236032 A1* | 10/2005 | Aoki .............................. | 136/252 |
| 2006/0130890 A1* | 6/2006 | Hantschel et al. ............ | 136/252 |
| 2008/0305247 A1* | 12/2008 | Von Klopmann et al. ...... | 427/74 |
| 2009/0320916 A1* | 12/2009 | Yuan et al. .................... | 136/256 |
| 2010/0065418 A1* | 3/2010 | Ellmer et al. ............ | 204/192.13 |
| 2010/0224245 A1* | 9/2010 | Bartholomeusz et al. .... | 136/256 |
| 2010/0229940 A1* | 9/2010 | Basol ............................ | 136/256 |
| 2010/0294346 A1* | 11/2010 | Frolov et al. .................. | 136/252 |
| 2010/0319776 A1* | 12/2010 | Choe et al. .................... | 136/262 |
| 2011/0048493 A1* | 3/2011 | Yun et al. ...................... | 136/244 |
| 2011/0053351 A1* | 3/2011 | Tsai et al. ..................... | 438/475 |
| 2011/0065228 A1* | 3/2011 | Li ................................. | 438/94 |
| 2011/0094557 A1* | 4/2011 | Mitzi et al. .................... | 136/244 |
| 2011/0259418 A1* | 10/2011 | Hollars ......................... | 136/256 |
| 2011/0263072 A1* | 10/2011 | Lee et al. ....................... | 438/95 |
| 2011/0308584 A1* | 12/2011 | Joshi et al. .................... | 136/255 |
| 2012/0061250 A1* | 3/2012 | Ahmed et al. ................ | 205/310 |
| 2012/0061790 A1* | 3/2012 | Ahmed et al. ................ | 257/459 |
| 2012/0080306 A1* | 4/2012 | Zhong et al. ............. | 204/192.11 |
| 2012/0100663 A1* | 4/2012 | Bojarczuk et al. ............ | 438/73 |
| 2012/0107488 A1* | 5/2012 | Frey et al. ..................... | 427/66 |
| 2012/0107996 A1* | 5/2012 | Sheng et al. .................. | 438/71 |
| 2012/0180858 A1* | 7/2012 | Zhong et al. .................. | 136/256 |

(Continued)

*Primary Examiner* — Jarrett Stark
*Assistant Examiner* — Bitew Dinke
(74) *Attorney, Agent, or Firm* — Cantor Colburn LLP; Vazken Alexanian

(57) ABSTRACT

Embodiments relate to a method for annealing a solar cell structure including forming an absorber layer on a molybdenum (Mo) layer of a solar cell base structure. The solar cell base structure includes a substrate and the Mo layer is located on the substrate. The absorber layer includes a semiconductor chalcogenide material. Annealing the solar cell base structure is performed by exposing an outer layer of the solar cell base structure to a plasma.

23 Claims, 7 Drawing Sheets

(56) References Cited

U.S. PATENT DOCUMENTS

| | | | |
|---|---|---|---|
| 2012/0223302 A1* | 9/2012 | Yukinobu et al. | 257/43 |
| 2012/0279420 A1* | 11/2012 | Liao et al. | 106/31.92 |
| 2012/0288987 A1* | 11/2012 | Radu et al. | 438/95 |
| 2013/0115423 A1* | 5/2013 | Ii et al. | 428/141 |
| 2013/0164918 A1* | 6/2013 | Liang et al. | 438/478 |
| 2013/0168825 A1* | 7/2013 | Bhattacharya | 257/613 |
| 2013/0210191 A1* | 8/2013 | Van Duren et al. | 438/95 |
| 2013/0316182 A1* | 11/2013 | Mori | 428/448 |

* cited by examiner

PLASMA ANNEALING OF THIN FILM SOLAR CELLS

BACKGROUND

The present disclosure relates to thin film solar cells, and in particular to performing plasma annealing of thin film solar cells.

Solar cells are photovoltaic devices that convert sunlight directly into electrical power. Generally, p-n junction based photovoltaic cells include a layer of an n-type semiconductor in direct contact with a layer of a p-type semiconductor. When a p-type semiconductor is positioned in intimate contact with an n-type semiconductor, a diffusion of electrons occurs from the region of high electron concentration (the n-type side of the junction) into the region of low electron concentration (the p-type side of the junction). However, the diffusion of charge carriers (electrons) does not happen indefinitely, as an opposing electric field is created by this charge imbalance. The electric field established across the p-n junction induces a separation of charge carriers that are created as result of photon absorption.

The most common type of solar cell material is silicon, which is in the form of single or polycrystalline wafers. However, the cost of electricity generated using silicon-based solar cells is still higher than the cost of electricity generated by the more traditional methods. Since the early 1970's there has been an effort to reduce cost of solar cells for terrestrial use. One way of reducing the cost of solar cells is to develop low-cost, thin-film growth techniques that can deposit solar cell quality absorber materials on large area substrates and to fabricate these devices using high-throughput, low-cost methods.

The increased interest in thin-film photovoltaics has been due primarily to improvements in conversion efficiency of cells made at the laboratory scale, with the anticipation that manufacturing costs can be significantly reduced compared to the older and more expensive crystalline and polycrystalline silicon technology. The term "thin-film" is thus used to distinguish this type of solar cell from the more common silicon based cell, which uses a relatively thick silicon wafer. While single crystal silicon cells still demonstrate the best conversion efficiency to date at over 20%, thin-film cells have been produced which can perform close to this level. As such, performance of the thin-film cells is no longer the major issue that limits their commercial use. Instead, primary factors now driving the commercialization of thin-film solar cells include cost, manufacturability, reliability and throughput, for example.

SUMMARY

Exemplary embodiments include forming an absorber layer on a molybdenum (Mo) layer of a solar cell base structure. The solar cell base structure includes a substrate and the Mo layer located on the substrate, and the absorber layer comprises a semiconductor chalcogenide material. The method includes annealing the solar cell base structure by exposing an outer layer of the solar cell base structure to plasma.

Additional exemplary embodiments include a method for annealing a solar cell structure including forming a solar cell structure including a substrate, a molybdenum (Mo) layer formed on the substrate, an absorber layer formed on the Mo layer, a buffer layer formed on the absorber layer, and a transparent conductive oxide (TCO) layer formed on the buffer layer. The method includes annealing the solar cell structure by exposing the TCO layer to plasma formed by a gas including oxygen.

Additional exemplary embodiments include forming a preliminary absorber layer on a molybdenum (Mo) layer. The Mo layer is formed on a substrate and the absorber layer comprises at least one of an alloy and a semiconductor chalcogenide material. The method includes annealing the preliminary absorber layer and the Mo layer and sulfurizing the preliminary absorber layer by exposing the at least one of the alloy and the semiconductor chalcogenide material to plasma formed from a gas comprising sulfur.

Additional features and advantages are realized through the techniques of the present disclosure. Other embodiments and aspects of the present disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter of the disclosure is particularly pointed out and distinctly claimed in the claims at the conclusion of the specification. The forgoing and other features, and advantages of the disclosure are apparent from the following detailed description taken in conjunction with the accompanying drawings in which:

DETAILED DESCRIPTION

Conventional annealing techniques of solar cells cause delamination of layers within the solar cells, resulting in loss of efficiency. In exemplary embodiments of the present disclosure, a solar cell structure is exposed to plasma while annealing is performed, permitting annealing at a lower temperature, providing reduced damage to the solar cell, and increasing the efficiency of the solar cell.

Figure 1:
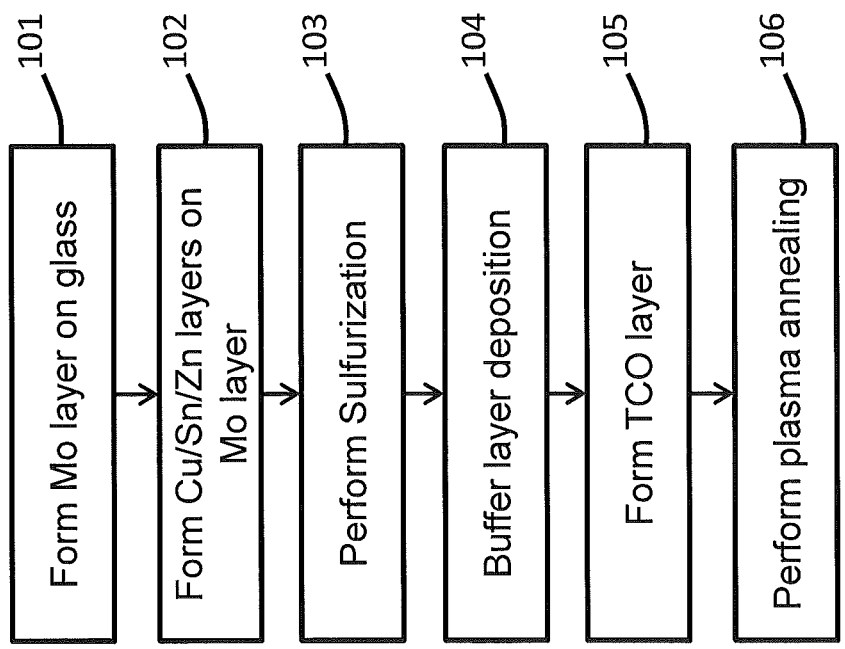
FIG. 1 illustrates a flowchart of a method according to one embodiment of the present disclosure.
Figure 2:
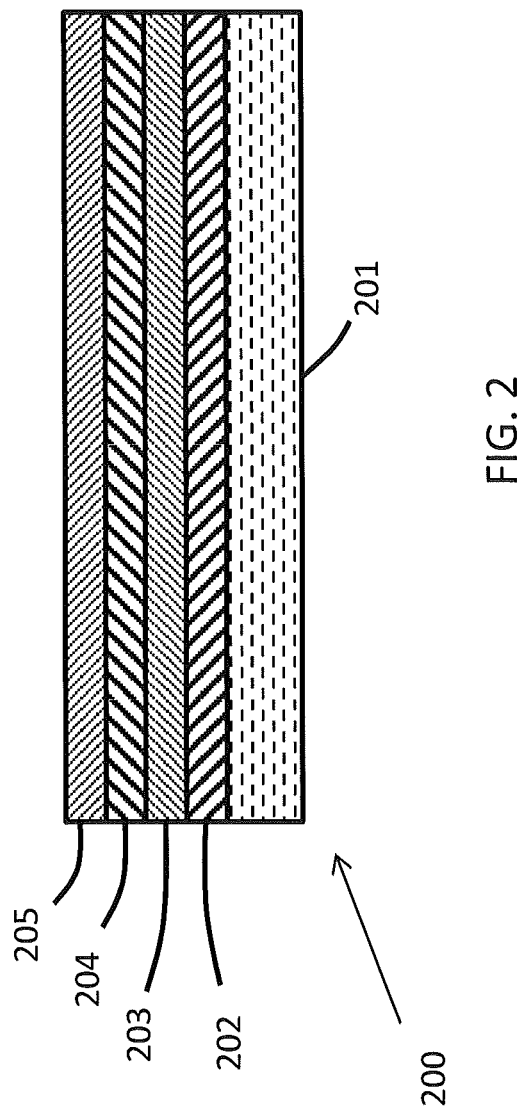
FIG. 2 illustrates a preliminary solar cell structure according to one embodiment.

FIG. 1 illustrates a method of annealing a solar cell structure according to an embodiment of the disclosure. FIG. 2 illustrates a preliminary solar cell structure 200 according to one embodiment. In block 101, a substrate 201 is provided and a molybdenum (Mo) layer 202 is formed on the substrate 201. The substrate 201 may be, for example, a glass layer, a metal layer, or a plastic layer. The Mo layer 202 may be formed by a sputtering process and may have a thickness between 600 nm (nanometers) to 1 μm (micron) thick. In block 102, one of an alloy and a semiconductor chalcogenide layer may be formed on the Mo layer 202. For purposes of description, the present specification will refer to the semiconductor chalcogenide in further detail hereafter. The chalcogenide layer may comprise copper (Cu) 203, tin (Sn) 204 and zinc (Zn) 205. In one embodiment, the chalcogenide layer is formed from layers of copper, tin and zinc 203, 204 and 205 which are formed by sputtering, electroplating, chemical bath deposition (CBD), physical vapor deposition (PVD) or by any other deposition process.

In one embodiment, a ratio of a thickness of copper to tin is between 1/1.5 and 1/2.0. In one embodiment, the ratio of the thickness of copper to tin is 1/1.78. In one embodiment, a ratio of a thickness of zinc to tin is between 1/1.2 and 1/1.4. In one embodiment, the ratio of the thickness of zinc to tin is 1/1.35. In one embodiment, a ratio of a thickness of copper to tin and zinc is between 1/0.5 and 1/0.95. In one embodiment, the ratio of the thickness of copper to tin and zinc is 1/0.78.

In one embodiment, the semiconductor chalcogenide comprises a plurality of annealed layers, for example, a copper zinc (CuZn) layer and a copper tin (CuSn) layer. In one embodiment, the CuZn layer and the CuSn layer are formed in a soft annealing process at a temperature between 200 to 400 degrees Celsius.

In one embodiment, the semiconductor chalcogenide material layer includes a semiconductor chalcogenide material. As used herein, a "chalcogenide" refers to the group consisting of sulfides and selenides. As used herein, a "semiconductor material" refers to a material having a conductivity in the range of $10^3$ Siemens per centimeter to $10^{-8}$ Siemens per centimeter. As used herein, a "semiconductor chalcogenide material" refers to a semiconductor material that includes a chalcogenide at an atomic concentration greater than 5%. A thin film solar cell according to one embodiment includes a chalcogenide as an absorber layer. The chalcogenide can be a chalcopyrite such as $CuIn(S,Se)_2$ (CIS) and $CuInGaSe_2$ (CIGS), kesterite ($Cu_2(Zn, Fe) Sn (Se,S)_4$, $Ga(S, Se)$, $GaTe$, $GaAs$, $In_2(S,Se)_3$, $InTe$, $InP$, $CdTe$, $Cd(S, Se)$, $ZnTe$, $Zn_3P_2$, $Pb(Se,S)$, $Zn(S, Se)$, $W(S,Se)_2$, $Bi_2S_3$, $Ag_2S$, $NiS$, $ZnO$, $Cu_2O$, $CuO$, $Cu_2S$, $FeS_2$. The solar cell may be fabricated using different process like physical vapor deposition (PVD), chemical vapor deposition (CVD), solution processes, or electrochemical deposition process.

Figure 3:
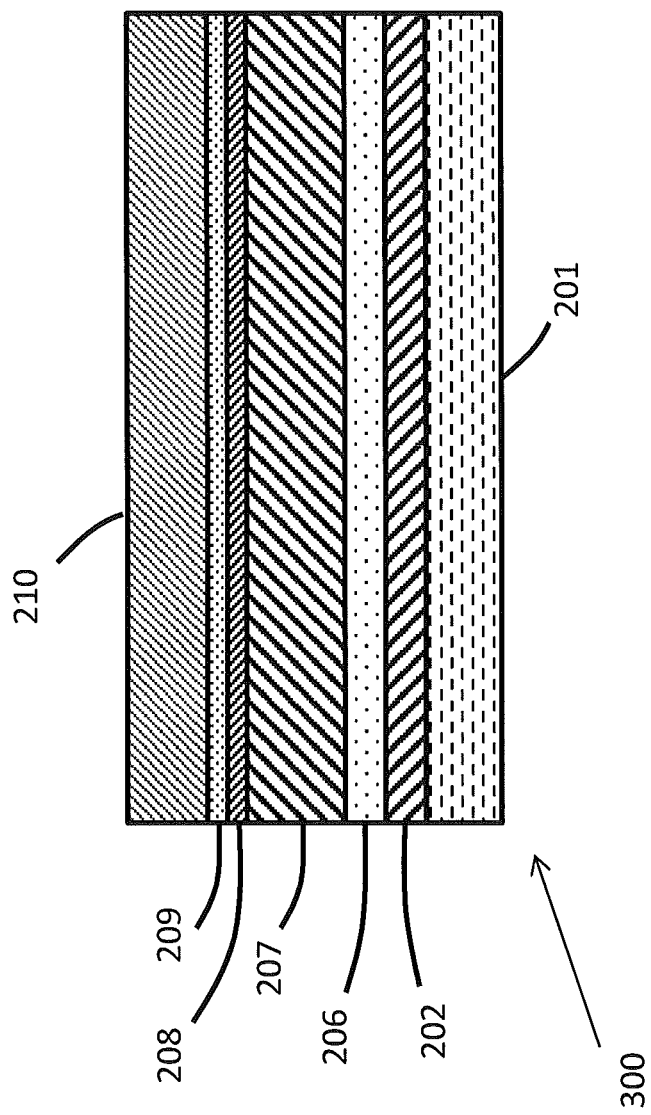
FIG. 3 illustrates a solar cell structure according to one embodiment.

FIG. 3 illustrates a solar cell structure 300 according to one embodiment of the present disclosure. Referring to FIGS. 1-3, in block 103 of FIG. 1, sulfurization of the preliminary solar cell structure 200 is performed by annealing the solar cell structure 200 in at atmosphere including sulfur (S). In one embodiment, sulfurization results in a molybdenum disulfide ($MoS_2$) layer 206 formed on the Mo layer 202 and an alloy layer 207, such as a chalcogenide layer comprised of copper zinc tin selenium and sulfur ($Cu2\ ZnSn(Se,S)4$).

Figure 4:
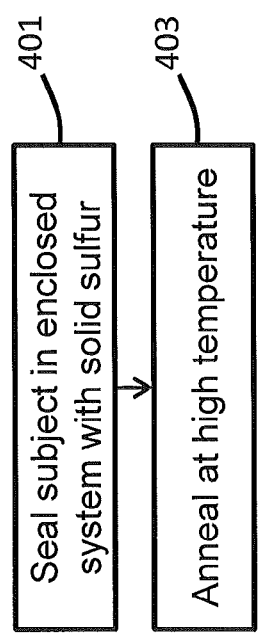
FIG. 4 illustrates a sulfurization method according to one embodiment of the present disclosure.

FIG. 4 illustrates a process for sulfurization according to one embodiment. In block 401, a subject, such as the preliminary solar cell structure 200, is enclosed within a system with solid sulfur. For example, the preliminary solar cell structure 200 may be enclosed in a chamber having solid sulfur located therein. In one embodiment, the amount of solid sulfur is between five and twenty-five milligrams (mg). In block 403, the preliminary solar cell structure 200 is annealed at a high temperature. The annealing may be performed using a rapid thermal annealing (RTA) process using infrared (IR) lamps or lasers, or may be performed using a hot plate to heat the solar cell structure 200. In one embodiment, the preliminary solar cell structure 200 is annealed at a temperature greater than 500 degrees Celsius, such as between 550 and 590 degrees Celsius for between five and fifteen minutes. As a result, an annealed alloy layer is formed, such as the alloy layer 207 illustrated in FIG. 3. As discussed above, in one embodiment the alloy layer 207 is a copper tin zinc sulfur (CZTS) layer.

Figure 5:
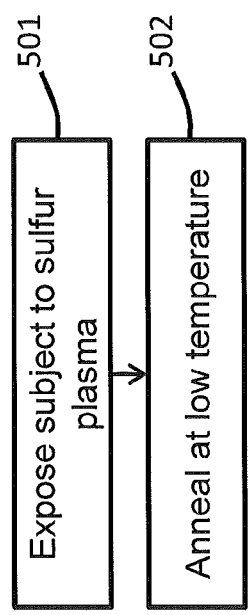
FIG. 5 illustrates a sulfurization method according to another embodiment.

FIG. 5 illustrates a process for sulfurization according to another embodiment of the present disclosure. In block 501, an outer layer of a subject, such as the preliminary solar cell structure 200, is exposed to plasma formed from a gas including sulfur. For example, in one embodiment the gas is hydrogen sulfide ($H_2S$). In block 502, the preliminary solar cell structure is annealed at a relatively low temperature. The annealing may be performed using a rapid thermal annealing (RTA) process using lamps or lasers, or may be performed using a hot plate to heat the preliminary solar cell structure 200. In one embodiment, the annealing is performed while the preliminary solar cell structure 200 is exposed to the gas including sulfur, or in other words, exposing the solar cell structure 200 to the sulfur plasma may be part of, or contribute to, the annealing process.

In one embodiment, the annealing is performed at a temperature of around 400 degrees Celsius or less. In one embodiment, the annealing is performed at a temperature between 300 and 400 degrees Celsius. As a result, an annealed alloy layer is formed, such as the alloy layer 207 illustrated in FIG. 3. As discussed above, in one embodiment the alloy layer 207 is a copper tin zinc selenium sulfur (CZTS) layer. Since the annealing is performed at a relatively low temperature (i.e., at around 400 degrees Celsius or less, compared to 500 degrees Celsius or greater), damage to the solar cell structure 300 is reduced, improving the performance characteristics of the solar cell structure 300.

Figure 6:
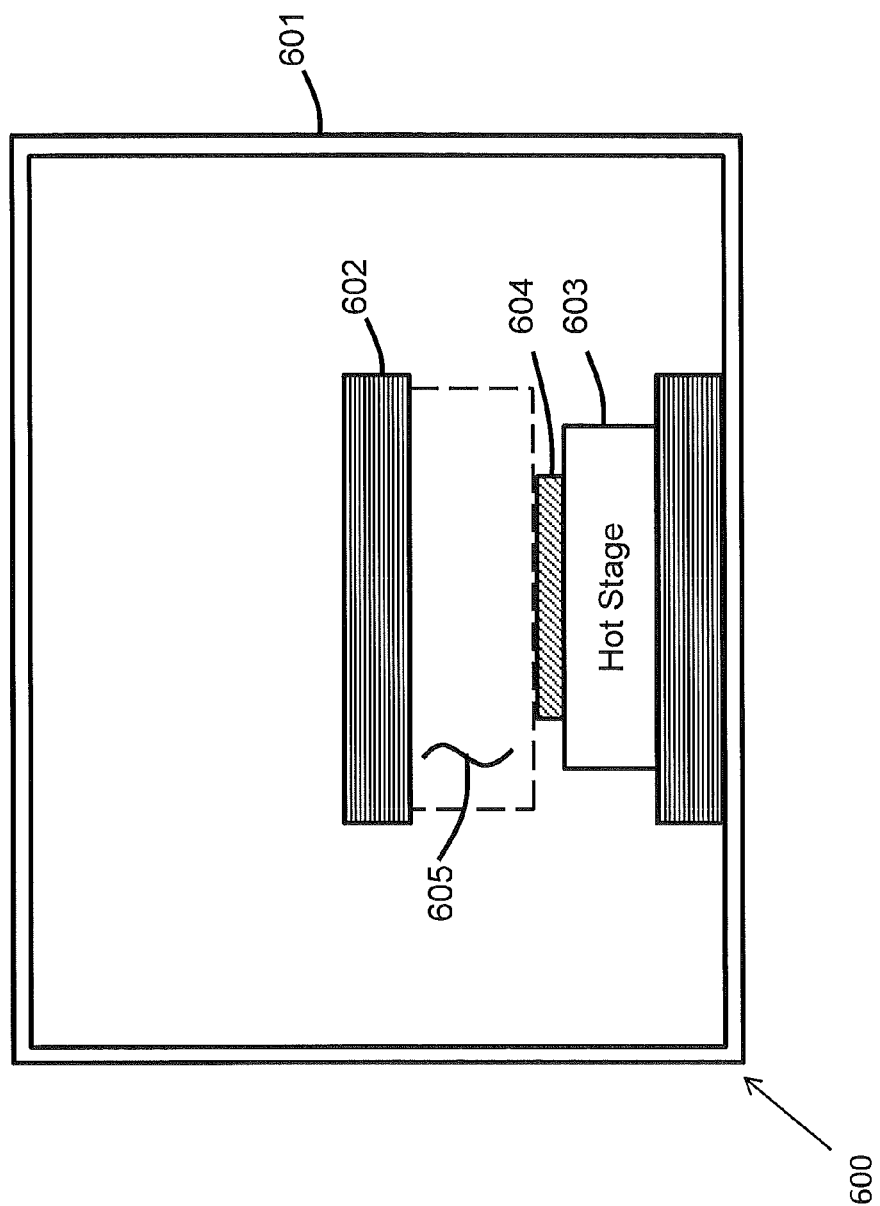
FIG. 6 illustrates an annealing device according to one embodiment.

FIG. 6 illustrates a device 600 for performing plasma annealing according to an embodiment of the present disclosure. The device 600 includes a sealed chamber 601. Radio frequency (RF) coils 602 are positioned within the chamber 601. A hot stage 603, or hot plate 603, is positioned above a lower RF coil 602. A subject 604, such as the preliminary solar cell structure 200 of FIG. 2, is positioned on the hot stage 603 between the RF coils 602. The hot stage 603 may comprise, for example, a copper bar configured to transmit heat to the subject 604.

In operation, a gas is introduced into the sealed chamber 601. Power is provided to the RF coils 602 and the hot stage 603. Plasma 605 is generated by the RF coils 602, and the plasma has a chemical make-up based on the chemical composition of the gas introduced into the sealed chamber 601. The plasma 605 is represented in FIG. 6 by dashed lines. As illustrated in FIG. 6, the plasma 605 contacts an upper surface of the subject 604 and may heat the subject 604 via the upper surface. As discussed above, while the RF coils 602 generate the plasma 605, the hot stage 603 may heat the subject 604 to perform annealing of the subject.

In embodiments of the present disclosure, annealing with plasma 605 may be performed at a lower temperature than annealing in an atmosphere, or annealing without plasma. For example, annealing without plasma may occur at a temperature of 500 degrees Celsius or greater, while annealing with plasma may occur at a temperature of 400 degrees Celsius or less Annealing at the lower temperature may result in reduced damage to the subject 604 as a result of delamination of layers of the subject 604, such as delamination of the $MoS_2$ layer 203 of the solar cell structure 300 from the alloy layer 207 of FIG. 3.

Referring again to FIGS. 1 and 3, in block 104, a buffer layer is formed on the alloy layer 207. The buffer layer may be formed by electroplating, PVD, CBD or by any other deposition method. The buffer layer may include, for example, a cadmium sulfide (CdS) layer 208, and an intrinsic zinc oxide (i-ZnO) layer 209.

In one embodiment, prior to forming the buffer layer, etching may be performed. For example, the preliminary solar cell structure resulting from the annealing may be etched using sodium cyanide (NaCN) and/or potassium cyanide (KCN) for a predetermined period of time, such as three minutes. The preliminary solar cell structure resulting from the annealing may further be soaked in deionized water (di-water) for a predetermined period of time, such as at least ten minutes.

In block 105, a transparent conductive oxide (TCO) layer 210 may be formed on the i-ZnO layer 209. In one embodiment, the TCO comprises indium tin oxide (ITO). In another embodiment, the TCO comprises of aluminum doped ZnO (Al—ZnO). In addition, electrodes may be formed on the TCO layer 210. In one embodiment, the electrodes comprise metal grids made up of a conductive material, such as copper or nickel and aluminum.

Figure 7:
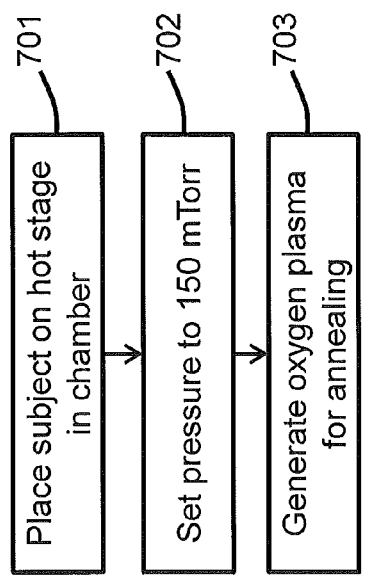
FIG. 7 illustrates a flowchart of a method of oxygen plasma annealing according to an embodiment of the present disclosure.

In block 106, plasma annealing may be performed on the solar cell structure 300. In particular, the solar cell structure 300 may be subject to oxygen plasma and annealed. FIG. 7 illustrates a process for oxygen plasma annealing according to one embodiment.

In block 701, a subject, such as the solar cell structure 300, is placed on a hot stage in a chamber. The hot stage may be a copper bar, for example. The chamber may correspond to the chamber 601 of FIG. 6, and the hot stage may correspond to the hot stage 603. In block 702, pressure within the chamber is set to 150 mTorr (milliTorr). In block 703, oxygen plasma 703 is generated for an annealing process. The oxygen plasma may contact an upper surface of the solar cell structure 300, or the TCO layer 210 and electrodes formed on the TCO layer 210 to heat the solar cell structure from the TCO layer 210 inward.

In particular, an oxygen valve to the chamber may be opened at 150 mTorr leading to the generation of plasma within the chamber when the partial pressure of oxygen in the chamber reaches 780 mTorr. The RF power may be set at 150 watts, and the annealing time may be of any predetermined duration, such as between 2 to 15 minutes.

According to embodiments of the present disclosure, performing annealing of a subject while exposing an upper surface of the subject to plasma allows for annealing at a lower temperature. As a result, delamination of layers in the subject is decreased, bonds between layers of the subject area strengthened, and damage resulting from high-temperature annealing is reduced. In particular, in embodiments in which the subject is a solar cell structure, the solar collection efficiency of the structure is improved, and delamination of layers, such as a $MoS_2$ layer from a CZTS layer, is decreased.

Embodiments of the present disclosure encompass an annealing process used to perform sulfurization of the subject, an annealing process after the subject is formed, or any other annealing process. For example, in an embodiment in which the subject is a solar cell structure, sulfur plasma may be applied to an upper surface of the solar cell structure while annealing is performed to perform a sulfurization process. In addition, oxygen plasma may be applied to the upper surface of the solar cell structure while the annealing is performed to perform a post-fabrication annealing process.

Performing oxygen plasma annealing of the solar cell structure including an ITO layer may improve oxidation of the ITO layer, may improve bonding of metal electrodes with the ITO layer, may improve bonding of the ITO layer with a buffer layer, such as a CdS layer, and may improve bonding of the CdS layer with a CZTS absorber layer. The improved bonding and oxidation lowers the series resistance of the solar cell device increases a fill factor (FF), cures p-n junction defects of the CdS layer with adjacent layers, and improves the short circuit current density $J_{SC}$.

In experiments, solar cell structures were prepared using hot plate annealing of the solar cell structure, similar to the solar cell structure 300 of FIG. 3, with oxygen plasma. In addition, a same number of solar cell structures were prepared using hot plate annealing of solar cell structures and infrared (IR) annealing of solar cell structures without plasma annealing. Using the hot plate annealing with the oxygen plasma, some example characteristics of the solar cell structures were as follows: average efficiency (Ave. Eff.): 5.135%, average form factor (Ave. FF.): 40.288% and average short circuit current density $J_{SC}$ (Ave. $J_{SC}$): 17.902 mA/cm$^2$ (milliamps per square centimeter). Using the hot plate annealing without plasma, some example characteristics of a set of solar cell structures was as follows (difference from plasma in parentheses): Ave. Eff.: 0.790% (−4.36%), Ave. FF.: 26.66% (−13.63%) and Ave. $J_{SC}$: 11.526 mA/cm$^2$ (−35%). Using IR annealing without plasma, the characteristics of a set of solar cell structures was as follows (difference from plasma in parentheses): Ave. Eff.: 2.226% (−2.91%), Ave. FF.: 37.254% (−3.03%), and Ave. $J_{SC}$: 12.939 mA/cm$^2$ (−27.72%).

In addition, solar cell structures annealed with the oxygen plasma and a hot plate measured series resistance values of 31 ohms (Ω), while the measured series resistance values of solar cells structures annealed with the hot plate and without the oxygen plasma were as low as 33.85 ohms.

In one example, performing oxygen plasma annealing of a solar cell structure, similar to the structure 300 of FIG. 3, for 5 minutes increased an efficiency of the structure by 2.73%, increased a form factor of the structure by 11.41%, improved a short circuit current density $J_{SC}$ by 4.108 mA/cm$^2$, or approximately 30%, and improved a series resistance of the structure by 40.419 ohms, or approximately 56%.

In contrast, a solar cell structure, similar to the solar cell structure 300 of FIG. 3, subjected to hot plate annealing for 5 minutes without performing oxygen plasma annealing resulted in a decrease in efficiency of 2.48%, a decrease in form factor of 28.12%, a decrease in short circuit current density $J_{SC}$ by 4.216 mA/cm$^2$, or approximately 44%, and an increase in series resistance of the structure by 248.31 ohms, or approximately 690%.

In a similar contrast, a solar cell structure, similar to the solar cell structure 300 of FIG. 3, subjected to IR annealing for 5 minutes without performing oxygen plasma annealing resulted in a decrease in efficiency of 0.81%, a decrease in form factor of 6.669%, and an increase in series resistance of the structure by 3.331 ohms, or approximately 7.8%.

As demonstrated by the above examples, which are representative of trends among large sets of fabricated solar cell structures, performing oxygen plasma annealing of a solar cell structure similar to the solar cell structure 300 of FIG. 3 improves the performance of the solar cell structure, while performing annealing without the oxygen plasma tends to impair performance of the solar cell structure.

According to the above-described embodiments, performing an annealing process of a device while subjecting the device to plasma reduces damage to the device caused by high-temperature annealing by allowing the annealing to be performed at a lower temperature. The plasma annealing further improves bonds within the device and improves operating characteristics, such as efficiency, form factor, short circuit current density and series resistance. While some advantages and technical benefits of the present disclosure have been described above, it is understood that embodiments of the present disclosure are not limited to the above-described advantages and technical benefits, and in some circumstances other advantages and technical benefits may apply, or any one of the above advantages and technical benefits may be inapplicable. In addition, embodiments of the present disclosure encompass variations in order of processes, variations in materials and variations in types of processes performed.

The plasma can be formed using a two parallel plate electrode or barrel electrode surrounding the ground electrode, where one electrode is grounded and the RF bias in applied to the other plate or barrel. The RF power can be anywhere from 10 watt to 1000 watt at gas pressure of 0.1 millitorr to 100 millitorr.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

While exemplary embodiments of the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A method for annealing a solar cell structure, comprising:
    forming an absorber layer on a molybdenum (Mo) layer of a solar cell base structure, the solar cell base structure including a substrate and the Mo layer located on the substrate, and the absorber layer comprising semiconductor chalcogenide material; and
    annealing and sulferizing the solar cell base structure by exposing an outer layer of the solar cell base structure to a plasma formed from a gas including sulfur, the plasma formed by positioning the solar cell base structure between radio frequency (RF) coils and activating the RF coils to form a region of plasma on the outer layer of the solar cell base structure,
    wherein annealing and sulferizing the solar sell base structure results in a preliminary solar cell structure, and the method further comprising:
    forming a buffer layer on the preliminary solar cell structure;
    forming a transparent conductive oxide (TCO) layer on the buffer layer; and
    annealing the preliminary solar cell structure including the buffer layer and the TCO layer by exposing the TCO layer to a plasma formed from a gas including oxygen.

2. The method of claim 1, wherein the solar cell base structure is annealed and sulfurized by annealing and sulfurizing the semiconductor chalcogenide material by exposing the semiconductor chalcogenide material to the plasma.

3. The method of claim 2, wherein the gas including sulfur is hydrogen sulfide ($H_2S$).

4. The method of claim 1, wherein the solar cell base structure is previously-annealed, having been annealed prior to the annealing of the solar cell base structure by exposing the outer layer of the solar cell base structure to the plasma, and
    the plasma is formed in a gas including oxygen.

5. The method of claim 1, wherein annealing the solar cell base structure results in a layer of $Cu_2ZnSn(Se,S)_4$.

6. The method of claim 1, wherein annealing the solar cell base cell structure results in a layer of a chalcogenide comprising at least one of $CuIn(S,Se)_2$ (CIS) and $CuInGaSe_2$ (CIGS), kesterite ($Cu_2$(Zn, Fe) Sn $(Se,S)_4$, Ga(S,Se), GaTe, GaAs, $In_2(S,Se)_3$, InTe, InP, CdTe, Cd(S, Se), ZnTe, $Zn_3P_2$, Pb(Se,S), Zn(S, Se), $W(S,Se)_2$, $Bi_2S_3$, $Ag_2S$, NiS, ZnO, $Cu_2O$, CuO, $Cu_2S$, $FeS_2$.

7. The method of claim 1, wherein the solar cell base structure is annealed and sulfurized at a temperature of about 400 degrees Celsius or less while exposing the solar cell base structure to the plasma.

8. The method of claim 1, further comprising:
    forming at least one buffer layer on a p-type semiconductor layer; and
    forming at least one transparent conductive oxide (TCO) layer on the at least one buffer layer.

9. The method of claim 8, wherein the at least one buffer layer includes a layer of cadmium sulfide (CdS) adjacent to the annealed semiconductor chalcogenide material and a layer of intrinsic tin oxide (i-ZnO) adjacent to the layer of CdS.

10. The method of claim 8, wherein the TCO layer comprises an indium tin oxide (ITO) layer.

11. The method of claim 8, wherein the TCO layer comprises an aluminum doped zinc oxide (Al—ZnO) layer.

12. The method of claim 1, wherein annealing the solar cell base structure includes annealing the semiconductor chalcogenide material by exposing the semiconductor chalcogenide material to the plasma, and
    annealing the semiconductor chalcogenide material includes performing infrared (IR) annealing of the solar cell base structure.

13. The method of claim 1, wherein annealing the solar cell base structure includes annealing a p-type semiconductor layer by exposing the p-type semiconductor layer to the plasma and positioning the solar cell base structure in a chamber between the radio frequency (RF) coils on a hot stage configured to heat the solar cell base structure.

14. A method for annealing a solar cell structure comprising:
    forming a solar cell structure including a substrate, a molybdenum (Mo) layer formed on the substrate, an absorber layer formed on the Mo layer, a buffer layer formed on the absorber layer, and a transparent conductive oxide (TCO) layer formed on the buffer layer; and
    annealing the solar cell structure by exposing the TCO layer and the buffer layer to a plasma formed by a gas including oxygen, the plasma formed by positioning the solar cell structure between radio frequency (RF) coils and activating the RF coils to form a region of plasma on the TCO layer.

15. The method of claim 14, wherein the solar cell structure is annealed at a temperature of 400 degrees Celsius or less.

16. The method of claim 14, wherein the absorber layer is a layer of $Cu_2ZnSn(Se,S)_4$.

17. The method of claim 14, wherein the TCO layer comprises indium tin oxide (ITO).

18. The method of claim 14, wherein the TCO layer comprises aluminum doped zinc oxide (Al—ZnO).

19. A method for annealing an absorber layer, comprising:
forming a preliminary absorber layer on a molybdenum (Mo) layer, the Mo layer being formed on a substrate and the preliminary absorber layer comprising at least one of an alloy and a semiconductor chalcogenide material; and
annealing the preliminary absorber layer and the Mo layer and sulfurizing the preliminary absorber layer by exposing the at least one of the alloy and the semiconductor chalcogenide material to a plasma formed from a gas comprising sulfur, the plasma formed by positioning the preliminary absorber layer between radio frequency (RF) coils and activating the RF coils to form a region of plasma on the outer layer of the preliminary absorber layer,
wherein annealing the preliminary absorber layer and the Mo layer and sulfurizing the preliminary absorber layer results in a preliminary solar cell structure, and the method further comprising:
forming a buffer layer on the preliminary solar cell structure;
forming a transparent conductive oxide (TCO) layer on the buffer layer; and
annealing the preliminary solar cell structure including the buffer layer and the TCO layer by exposing the TCO layer to a plasma formed from a gas including oxygen.

20. The method of claim 19, wherein annealing the preliminary absorber layer includes positioning the preliminary absorber layer in a chamber between the radio frequency (RF) coils on a hot stage configured to heat the preliminary absorber layer, the molybdenum (Mo) layer, and the substrate.

21. The method of claim 19, wherein the preliminary absorber layer is annealed and sulfurized at a temperature of 400 degrees Celsius or less.

22. The method of claim 19, wherein the preliminary absorber layer comprises copper zinc, and tin, and
annealing and sulfurizing the preliminary absorber layer results in a copper zinc tin and sulfur (CZTS) layer.

23. The method of claim 19, wherein the gas including sulfur is hydrogen sulfide ($H_2S$).

* * * * *